United States Patent [19]

Kuribayashi

[11] Patent Number: 5,012,427
[45] Date of Patent: Apr. 30, 1991

[54] SEMICONDUCTOR INTEGRATED CIRCUIT AND METHOD OF MANUFACTURING THE SAME

[75] Inventor: Mototaka Kuribayashi, Kawasaki, Japan

[73] Assignee: Kabushiki Kaisha Toshiba, Kawasaki, Japan

[21] Appl. No.: 303,261

[22] Filed: Jan. 30, 1989

[30] Foreign Application Priority Data

Jan. 30, 1988 [JP] Japan .................................. 63-20305
Mar. 23, 1988 [JP] Japan .................................. 63-67108

[51] Int. Cl.⁵ ........................ G06F 15/60; G06F 15/20
[52] U.S. Cl. .................................. 364/490; 364/489; 364/488; 307/480; 307/269
[58] Field of Search ............... 364/491, 490, 489, 488; 307/480, 269, 270

[56] References Cited

U.S. PATENT DOCUMENTS

| T935,003 | 6/1975 | Linville et al. | 364/490 |
| 4,447,870 | 5/1984 | Tague et al. | 364/900 |
| 4,577,276 | 3/1986 | Dunlop et al. | 364/491 |
| 4,661,721 | 4/1987 | Ushiku | 307/269 |
| 4,698,760 | 10/1987 | Lembach et al. | 364/490 |
| 4,755,704 | 7/1988 | Flora et al. | 307/269 |
| 4,858,143 | 8/1989 | Fournier | 364/489 |
| 4,906,872 | 3/1990 | Tanaka | 307/480 |

OTHER PUBLICATIONS

"A Routing Program Applicable to Various Chip Structures of Gate Arrays", by Masayuki Terai et al., Joho Shori Gakkai, Ronbunshi, vol. 25, No. 3, May 1984, pp. 357–364.

Primary Examiner—Parshotam S. Lall
Assistant Examiner—V. N. Trans
Attorney, Agent, or Firm—Oblon, Spivak, McClelland, Maier & Neustadt

[57] ABSTRACT

A semiconductor integrated circuit device comprises a plurality of cell arrays including at least one cell array having main and one feed-through cells, and a plurality of clock driver cells provided on the cell arrays. The feed-through cells are selectively connected to the clock driver cells so that loads imposed to the clock driver cells are made substantially uniform.

10 Claims, 15 Drawing Sheets

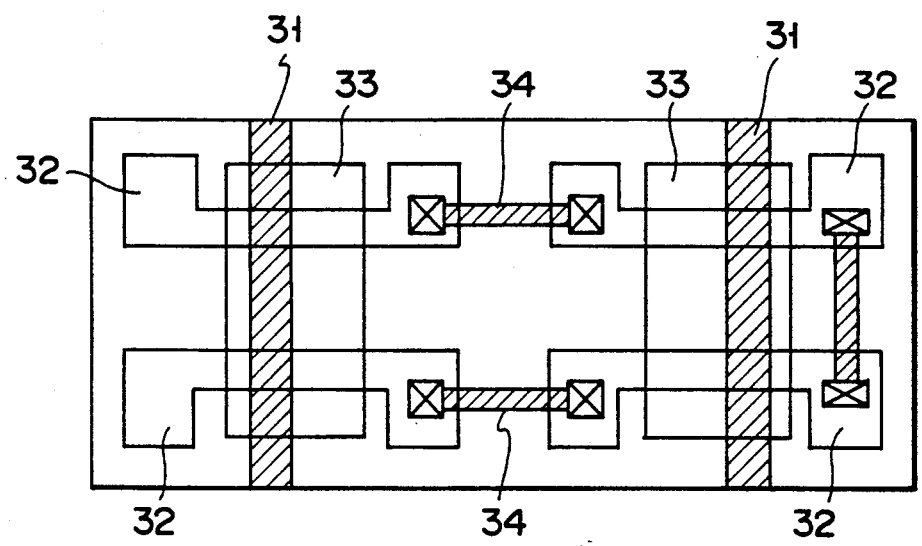
F I G. 3

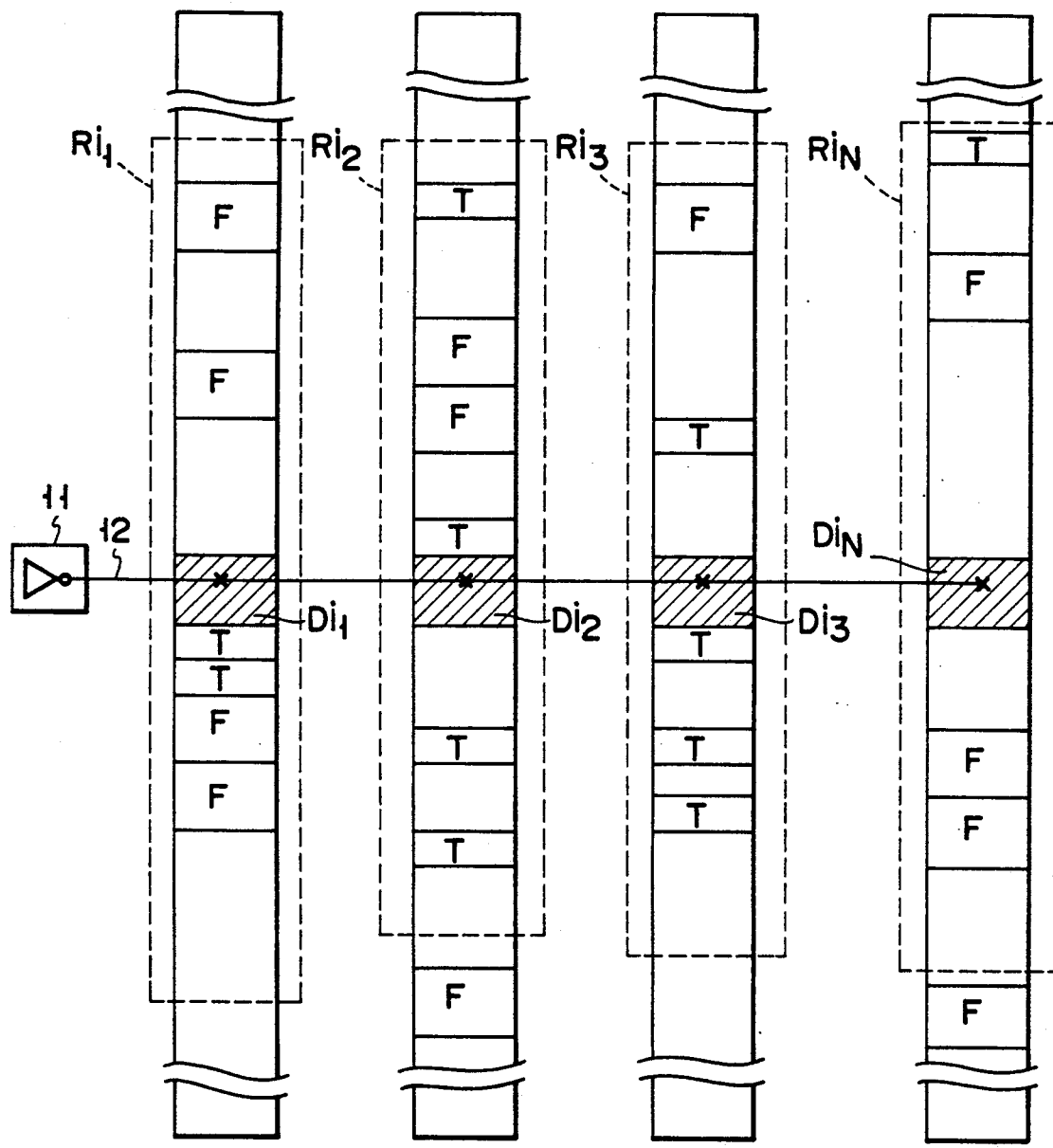
F I G. 6

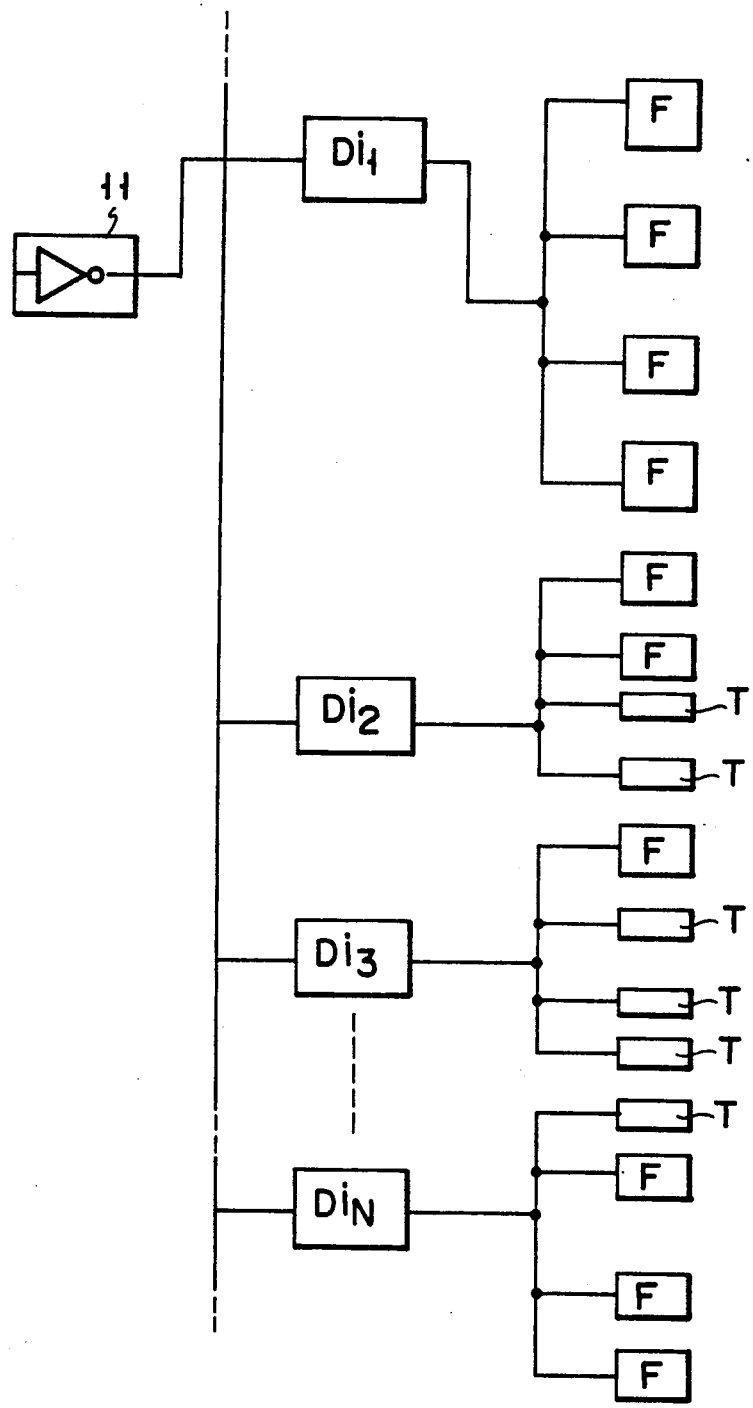
F I G. 8

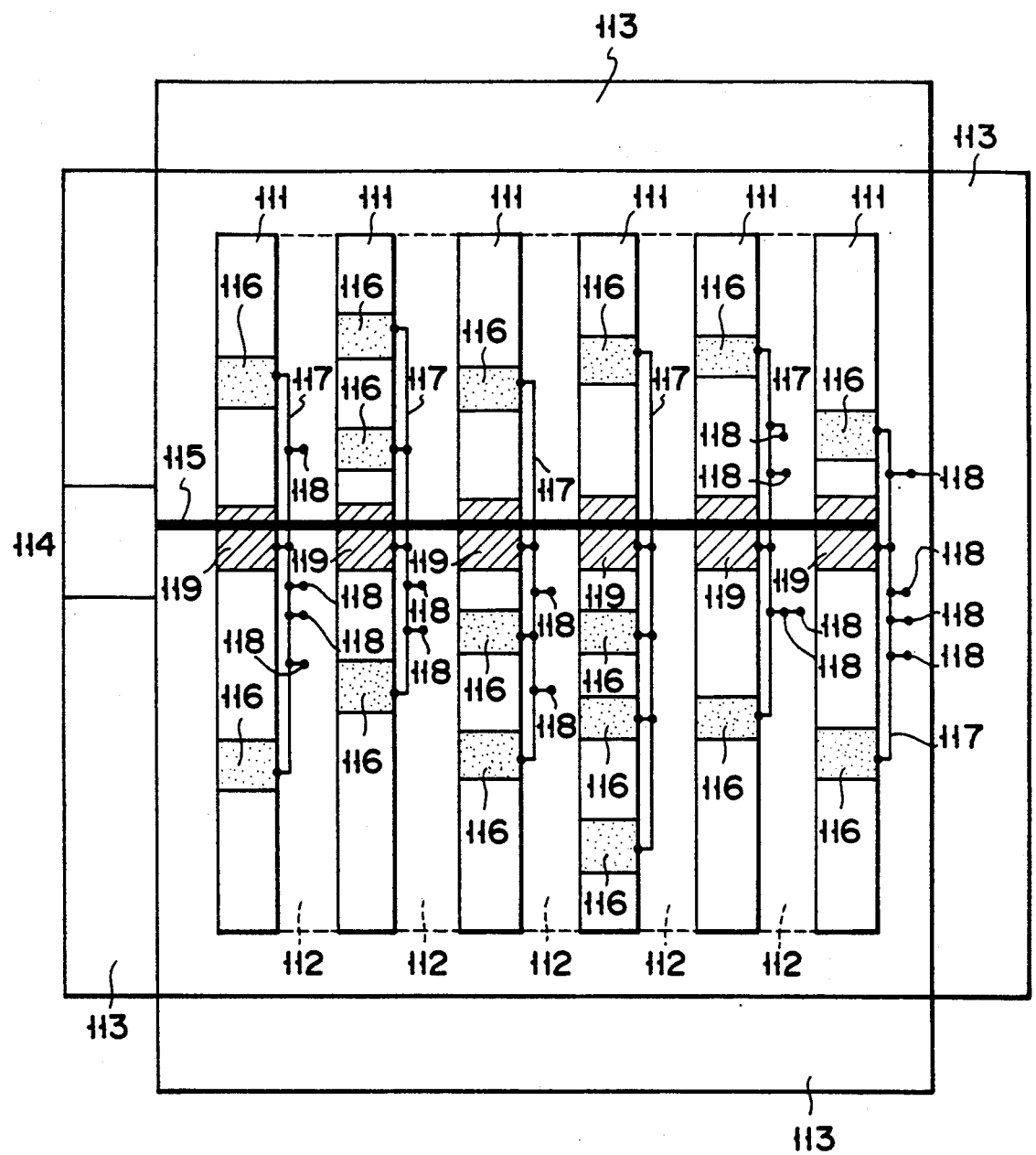
F I G. 10

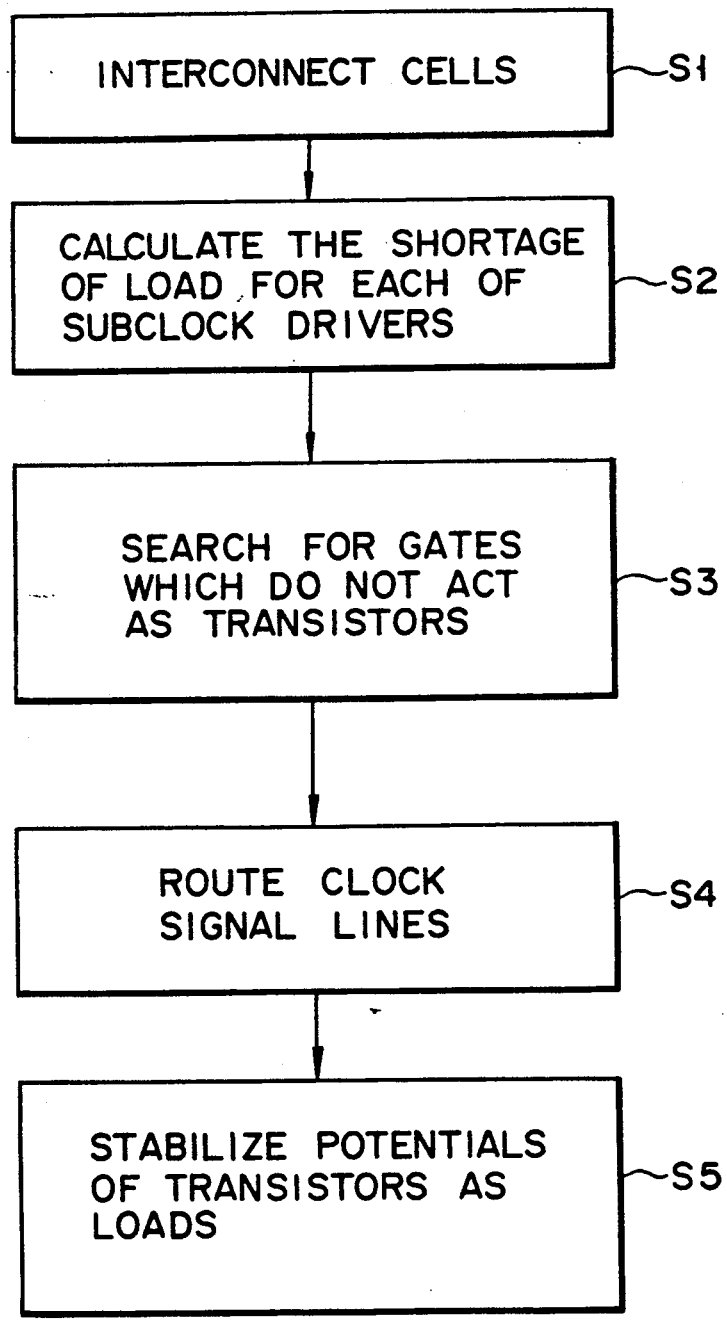
F I G. 11

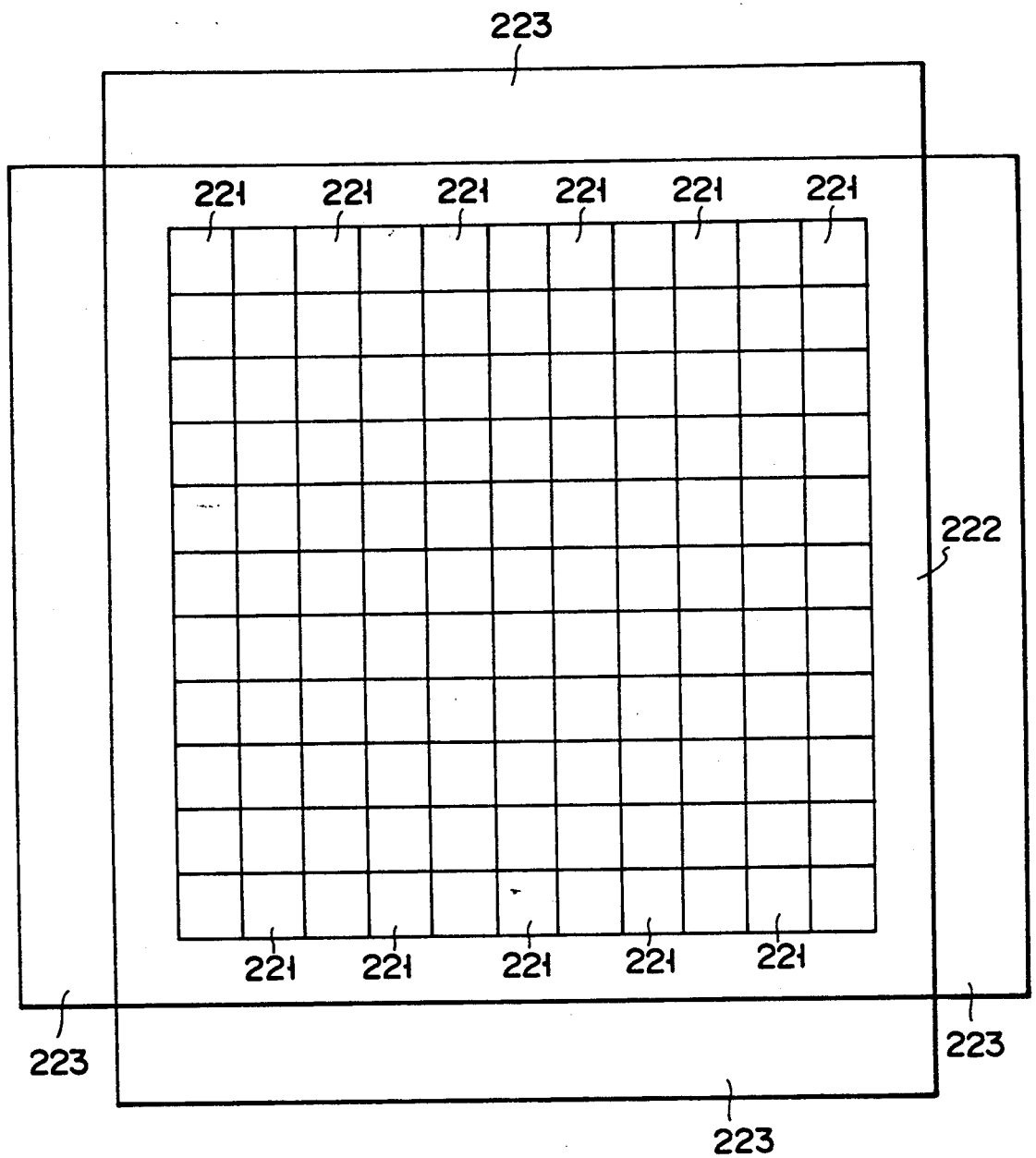
F I G. 15

SEMICONDUCTOR INTEGRATED CIRCUIT AND METHOD OF MANUFACTURING THE SAME

BACKGROUND OF THE INVENTION

1. Field of the Invention

The present invention relates to a semiconductor integrated circuit designed by a master slice or standard cell method and, more particularly, to the improvement of drawing-out of clock lines and a method of manufacturing the same.

2. Description of the Related Art

With the advance of large-scale integration of integrated circuits, the need has arisen to pay grave attention to the design of clock system. In a largescale integrated circuit, a large number of gates and flip-flops are put into operation in synchronization with a single clock signal. Thus, clock signal lines are wired all over a chip, and a large number of active elements are connected to the lines. According to such a large-scale integrated circuit, two following problems will arise.

(1) A clock driver having an extremely large current-driving capability is required in order to supply a large load with a clock signal.

(2) Noncoincident arrival of the clock signal at active elements, i.e., the clock skew occurs, causing an error in the operation timing in the integrated circuit.

Where a clock driver with great current-driving capability is formed in an integrated circuit, on one hand, a great variation in current will occur in the clock driver, switching noises will be generated locally, a supply voltage will vary, and a large amount of current will flow through the substrate. This will result in integrated circuit malfunctions. In CMOS integrated circuits in particular, there is a possibility of destruction of active elements due to latchup. On the other hand, the use of a clock driver with very great current-driving capability will increase the impedance of transmission paths. Therefore, the reduction of the clock skew cannot be expected.

To solve the above problems, there is an approach to distribute the output of the clock driver to subclock drivers and apply a clock signal to a flip-flop corresponding to each subclock driver. According to such an approach, the problem (1) can be solved in principle.

In manufacturing semiconductor devices in accordance with the polycell or master slice method, a layout work is performed for automatic placement and routing of cells. With this layout, the following method will be devised for the distribution of the clock driver output.

That is, a subclock driver cell is formed in each of cell arrays and subclock driver cells are connected to a system clock driver cell. Each subclock driver is connected to active elements, e.g. flip-flops via a signal line for application of clock pulses.

According to the above clock signal distribution method, the resistance of clock signal lines can be reduced. By thickening horizontal and vertical lines of the clock signal lines or peripheral lines, it is possible to much enhance the effect of reducing the resistance. Moreover, the above method can readily be handled by an automatic routing program. With such a clock distribution method, since the resistance component of a signal line between the system clock driver cell and each subclock driver cell is reduced, the clock skew virtually becomes negligible where the clock signal is observed at the input of each subclock driver cell. However, since the number of flip-flops connected to each subclock driver, i.e., the load of each subclock driver is not necessarily uniform, the clock skew will occur among flip-flops.

That is to say, in semiconductor integrated circuit devices formed in a layout according to an automatic placement and routing program, the clock skew due to variations in the load of the subclock drivers will be generated, resulting in causing malfunctions such as erroneous data transmission.

Such an automatic layout as described above, in which a system clock signal is divided into a plurality of subclock signals by subclock drivers, involves a problem of clock skew due to variations in the loading imposed on subclock drivers.

SUMMARY OF THE INVENTION

It is accordingly an object of the present invention to provide a semiconductor integrated circuit device which is capable of good clock distribution and prevents the generation of clock skew, without lowering the performance of an automatic placement and routing program.

According to the present invention, a virtual load or loads are selectively connected to subclock drivers so that the subclock drivers may have substantially uniform loads.

That is to say, in a semiconductor integrated circuit in which a system clock signal is supplied to a plurality of subclock drivers and each of the subclock drivers supplies a clock signal to main cells such as flip-flops, the subclock drivers supplied with the system clock signal are dispersedly disposed over a semiconductor chip, at least one main cell is connected to each of the subclock drivers, and each main cell is supplied with the clock signal from a corresponding subclock driver. One or more feed-through cells having a predetermined loading capacity are connected to a subclock driver, in which case the number of feed-through cells to be connected to the driver depends on the number of main cells connected to the driver. That is, the number of feed-through cells to be connected to the subclock drivers is determined such that the subclock drivers have substantially uniform loads.

In the method of manufacturing the semiconductor integrated circuit device of the invention, the feed-through cells are inserted in a semiconductor chip at the time of automatic placement and routing process of main cells, in which case the number of feed-through cells to be connected to a subclock driver is determined in accordance with the number of main cells in an area that is covered by the subclock driver.

According to the present invention, the loads of the subclock drivers can be made substantially equal to each other by the use of the feed-through cells, which are automatically inserted by the automatic placement or global wiring, as loads of the subclock drivers. Accordingly the clock skew in the semiconductor integrated circuit can be prevented, without causing the reduction of integration density of the whole chip which would result from new insertion of load cells.

BRIEF DESCRIPTION OF THE DRAWINGS

FIG. 3 shows a pattern of cells used in the semiconductor integrated circuit device shown in FIG. 1;

FIG. 6 shows a layout of a semiconductor integrated circuit device of FIG. 1, which has regions allocated to clock drivers;

FIG. 8 shows a equivalent circuit of the semiconductor integrated circuit device of FIG. 1;

FIG. 10 shows a layout of a semiconductor integrated circuit device according to another embodiment;

FIG. 11 shows a flowchart for drawing out the layout of the semiconductor integrated circuit device of FIG. 10;

FIG. 15 shows a circuit pattern of an integrated circuit device provided with basic gates arranged in a form of matrix.

DETAILED DESCRIPTION OF THE PREFERRED EMBODIMENTS

Figure 1:
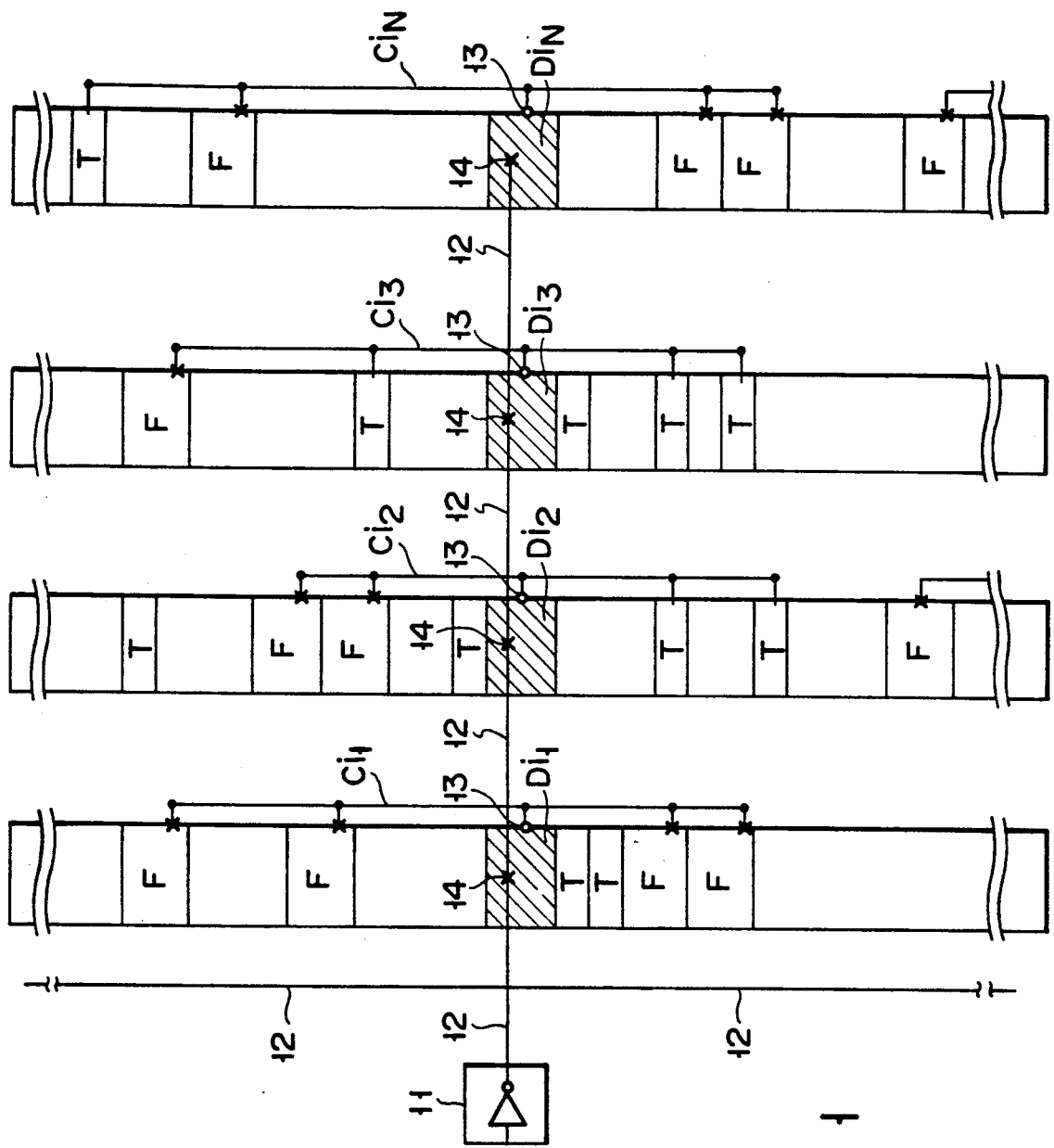
FIG. 1 shows a layout of a semiconductor integrated circuit device according to an embodiment of the present invention.

In a layout of a semiconductor integrated circuit as shown in FIG. 1, a system clock generating driver 11 is connected to a clock signal line 12. Connected to clock signal line 12 are main cells F, such as flip-flops, which need a clock signal and subclock drivers D (Dil–DiN). Each subclock driver D has an output terminal 13 (represented by 0) and an input terminal 14 (represented by X). Clock signal line 12 is divided into subclock lines C (Cil–CiN) by subclock drivers D. Feed-through cells serving as dummy load are denoted by T.

An equivalent circuit of the semiconductor integrated circuit device of FIG. 1 is shown in FIG. 8. Loading imposed on each subclock driver D is made substantially equal by feed-through cells T, reducing the clock skew.

Figure 2:
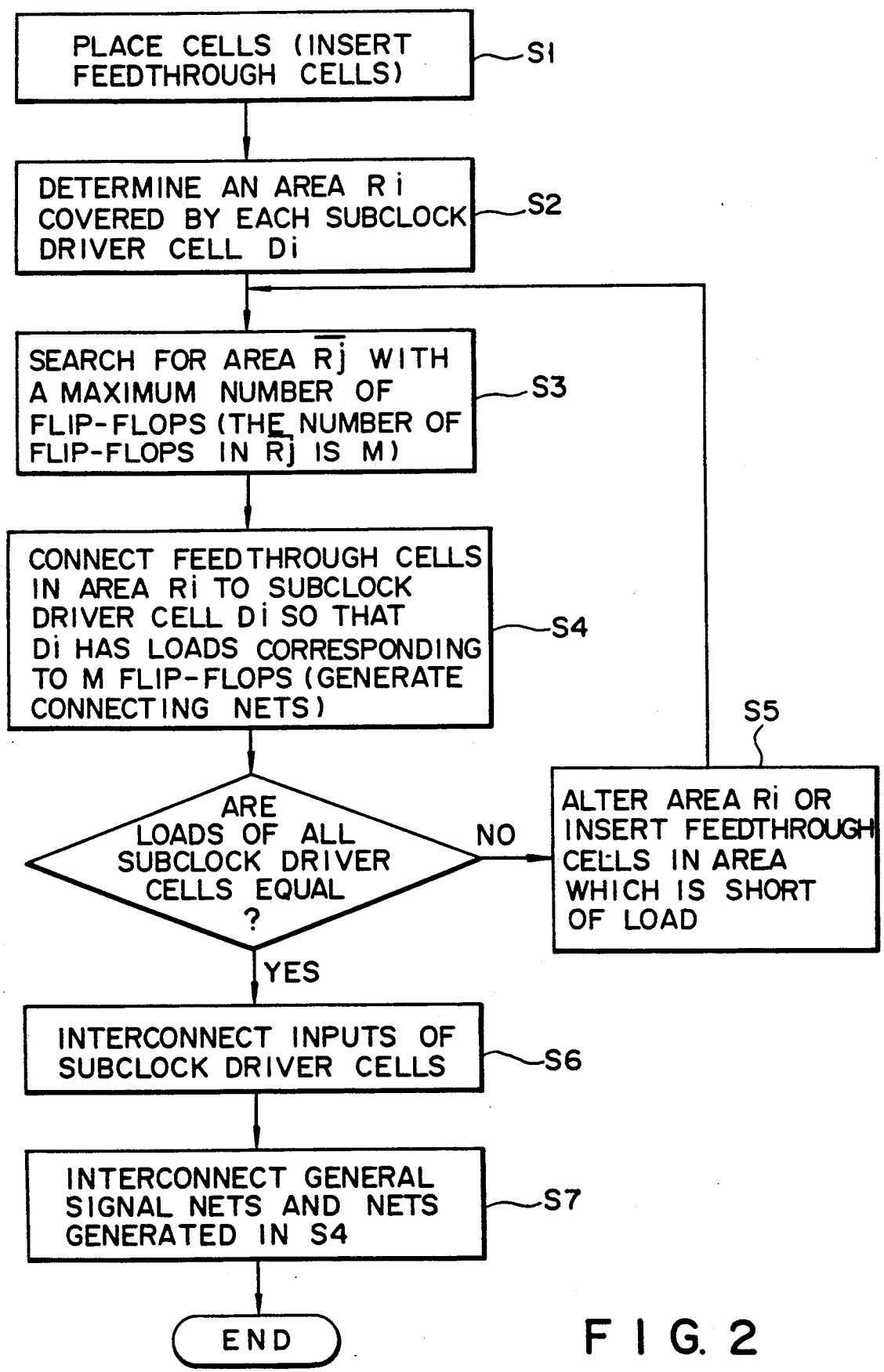
FIG. 2 shows a flowchart for drawing out the layout shown in FIG. 1.

A concrete procedure for implementing the arrangement of FIG. 1 will be described with reference to a flowchart of FIG. 2. This flowchart shows a procedure for implementing a clock distribution system by the use of the standard cell method.

In step S1, main cells F are placed on a chip. At this time feed-cells T are placed in such positions as to enhance the routing efficiency, for example, to shorten the length of signal lines and minimize the area of the chip. Feed-through cells T are used to run general signal lines therethrough at the time of global wiring of the general signal lines and may be configured as shown in FIG. 3. Referring to FIG. 3, there are shown a first layer 34 of metalization, which is adapted to connect a power supply line 31 and a gate 32 together, and a diffused region 33. Gate 32 is formed of polysilicon. Such feed-through cells are pre-designed and prepared as cells similarly to the other cells such as main cells and driver cells. The feed-through cell is designed to have the same load capacity as that of main cell F.

In inserting the feed-through cells in the chip, in step S1, subclock driver cells D are placed in the respective cell arrays so that they are aligned with each other. In this step, the feed-through cells are placed on the chip, simultaneously along with main cells F.

Figure 4:
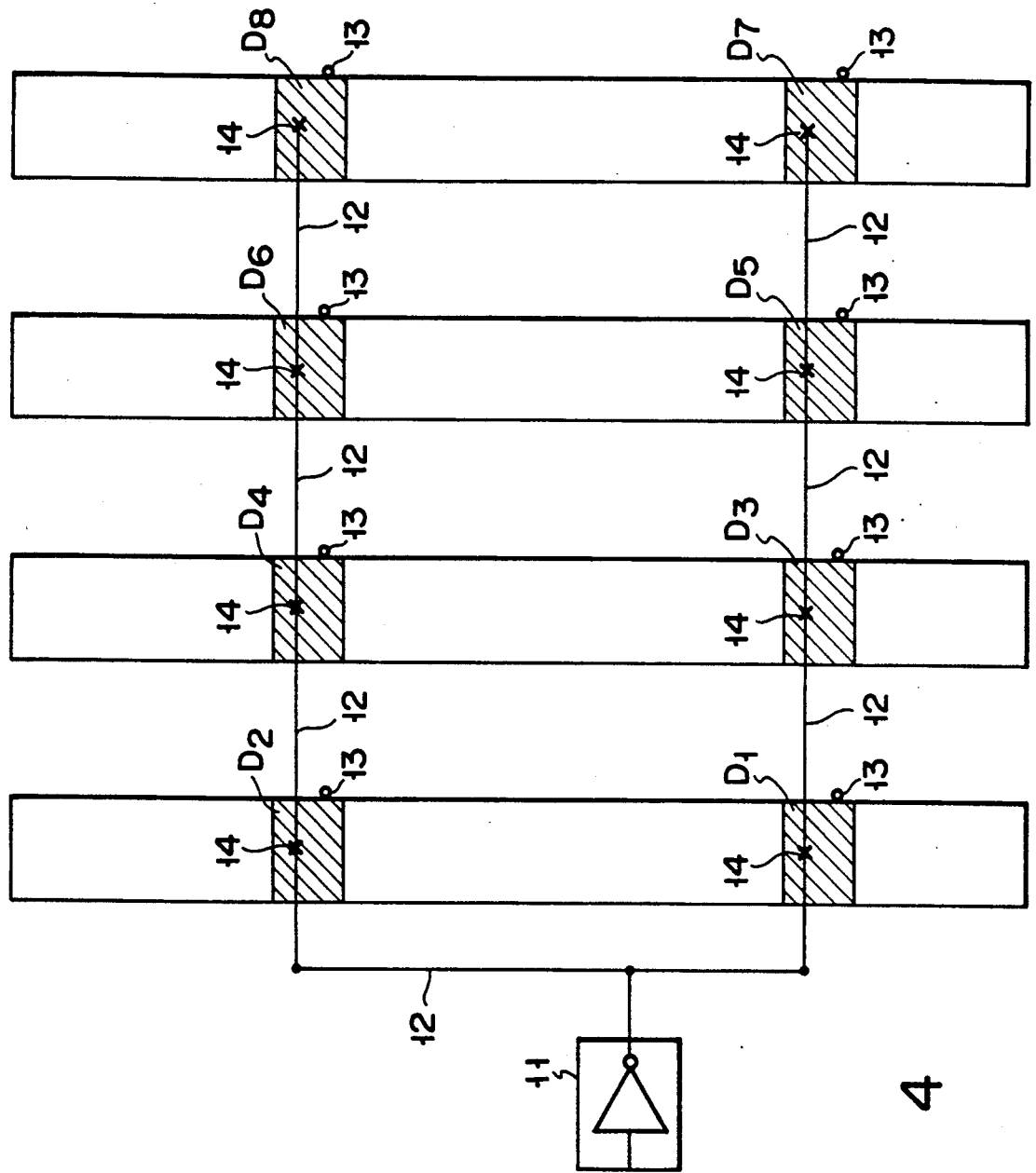
FIG. 4 shows a layout of a semiconductor integrated circuit device provided with a plurality of drivers in each cell array.
Figure 5:
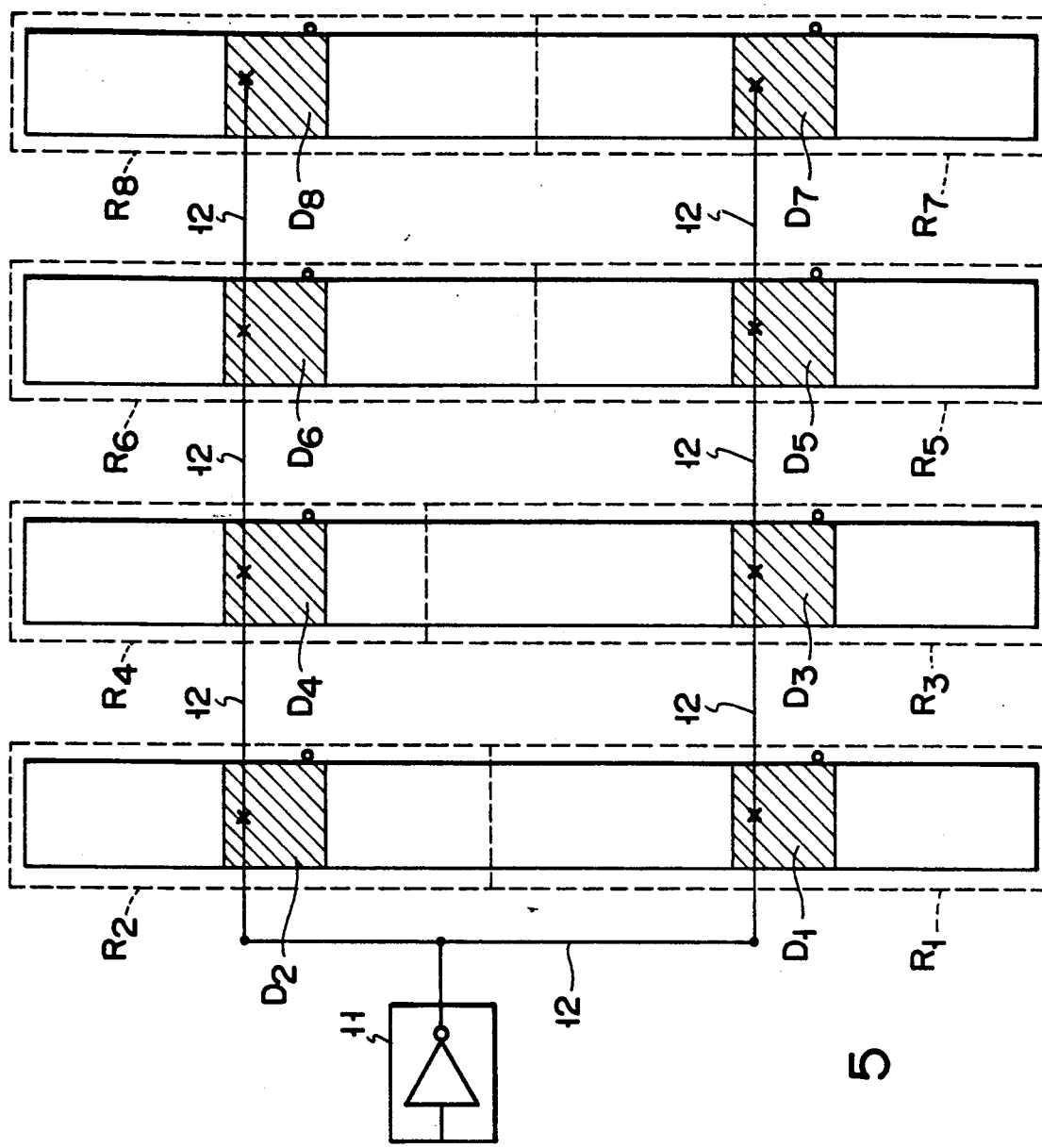
FIG. 5 shows a layout of a semiconductor integrated circuit device of FIG. 4, which has regions allocated to clock drivers.

In step S2, determination is made as to which of subclock driver cells D is used for connection thereto of flip-flops (main cells) F in the same array. A region involving main cells to be connected to clock driver cell Di is denoted by Ri. For example, where two subclock driver cells D (D1–D8) are inserted in each cell array as shown in FIG. 4, region Ri for each subclock driver cell Di is determined as shown in FIG. 5, taking the distribution of the flip-flops and the feed-through cells into consideration. Flip-flops F in region Ri are connected to subclock driver cell Di. In the case of the layout of FIG. 1, regions Ril–RiN for respective subclock driver cells Dil–DiN are determined as shown in FIG. 6.

Subsequently, regions Ril–RiN are searched for a region (Rj) having the largest number (M) of flip-flops in step S3. A load of M flip-flops, or a maximum load is imposed on subclock driver Dj in the region (Rj). In step S4, in order for each of the other subclock drivers Di to be loaded with M flip-flops, feed-through cells placed in region Ri are used to make up a shortage of loads. To this end, as shown in FIG. 1, nets Ci are formed on the chip so as to connect the subclock driver cells to the feed-through cells.

By the use of the feed-through cells which have already been formed on the chip in step S4, all subclock driver cells can be made virtually uniform in load. Such an approach for uniformalizing loads is adopted for the following reasons.

(1) In large-scale integrated circuits, a large number of feed-through cells are formed, and moreover these cells are not placed locally but distributed over the entire region of the chip.

(2) As a load, a flip-flop nearly equals one feed-through cell.

When the loads of the subclock driver cells cannot be made equal in step S4, the range of subclock driver cell region Ri is altered or feed-through cells are newly added in regions which are short of feed-through cells (step S5). Afterwards, steps S3 and S4 are carried out again so that all subclock driver cells may become uniform in their load. When loads are uniformalized, feed-through cells may be connected to clock drivers so that the clock skew becomes less than 0.5 ns.

In step S6, input terminals of subclock driver cells which are in alignment are connected with each other and connected to the output terminal of the system clock driver. The wiring can be made linearly and readily processed by an automated routing program. Hence, by thickening the line width it becomes possible to reduce the clock skew caused by wiring resistance in the subclock driver cells.

Figure 7:
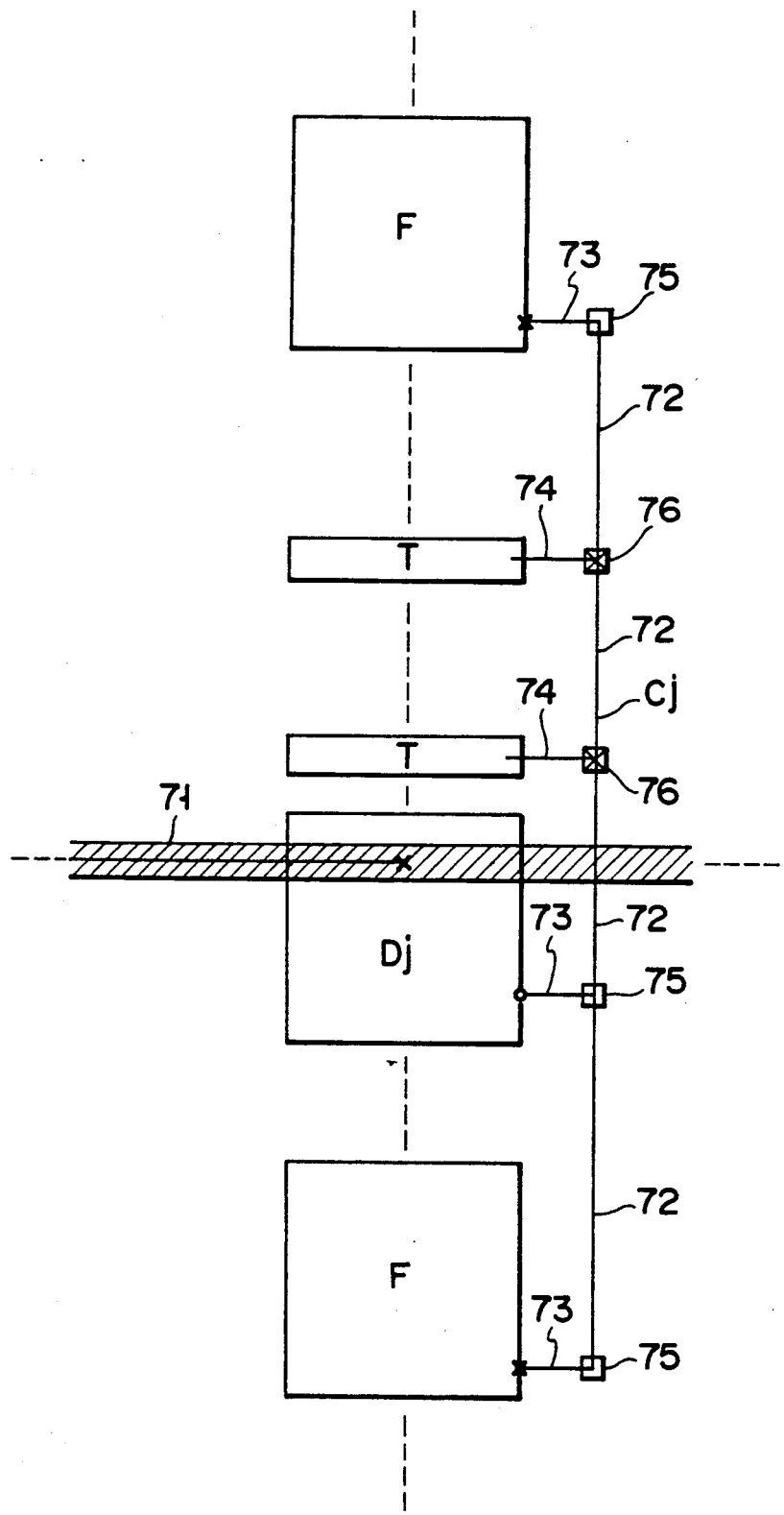
FIG. 7 shows a wiring pattern formed on one cell array.

In step S7, the wiring is achieved on the basis of the use of a first layer of metalization in the vertical direction and a second layer of metalization in the horizontal direction. However, the clock signal lines are formed in accordance with such a wiring process as shown in FIG. 7. In this Figure, a second layer 71 of metalization interconnects the subclock driver cells, and lines 72–74 are provided for transmitting clock signal Cj output from subclock driver cell Dj. Line 72 is formed of a first layer of metalization, line 73 a second layer of metalization and line 74 polysilicon. In addition, vias 75 and contacts 76 are formed. According to this wiring method, feed-through cells T allow through wiring of the second layer of metalization while keeping the feed-through cell function.

According to the embodiment, the loads of the subclock driver cells are made uniform because of the feed-through cells, with the result that the clock skew is reduced. Moreover, unlike a method of inserting loading dummy cells anew, this embodiment is very effective for the standard cell method because the integration density and utility are not decreased.

Next, a second embodiment of the invention will be described with reference to FIG. 9. This embodiment is concerned with a master slice integrated circuit device.

In the case of the master slice integrated circuit device, since the chip size is predetermined, the insertion of feed-through cells requires care. With the layout of a large-scale integrated circuit, the utilization rate of gates is about 70–85%. Hence 15–30% of all basic cells are not used as active elements but can be used as feed-through cells. Since there are enough feed-through cells that can be placed, they can freely be inserted in gate arrays so long as they do not exceed the length of gate arrays. The basic processing procedure for forming the master slice integrated circuits is the same as the flowchart shown in FIG. 2.

To implement the present invention by the use of master slice semiconductor integrated circuits, the cell shown in FIG. 3 may be used as the feed-through cells.

For example, two metal layers, i.e., metal first and second layers can be used as wiring layers, when a master slice is personalized. The metal first layer is provided parallel to the cell arrays and the metal second layer is provided perpendicular to the cell arrays. Through wiring is achieved by the metal second layer on the cell arrays.

Figure 9:
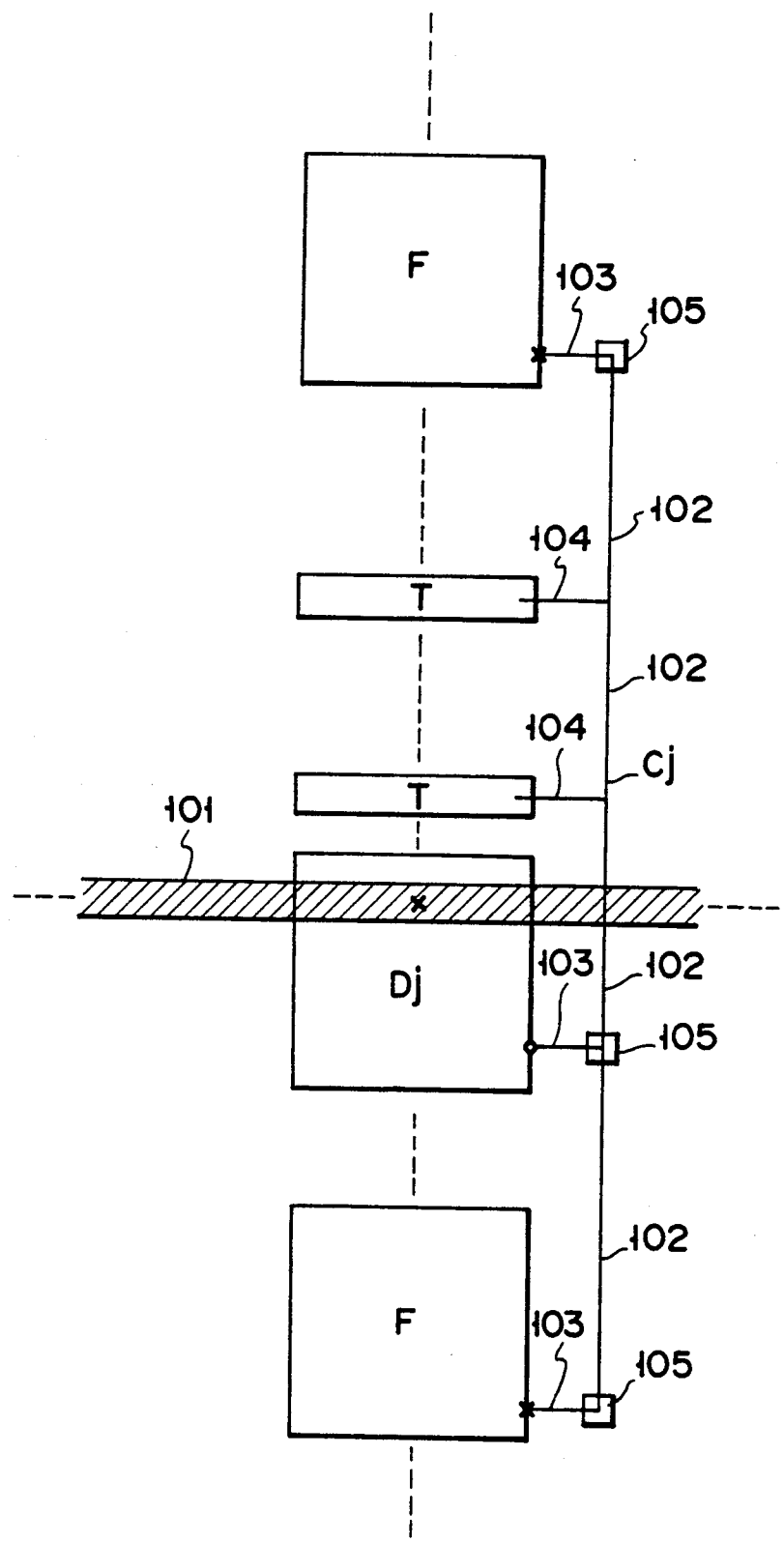
FIG. 9 shows another wiring pattern of one cell array.

Clock signal lines in step S7 are formed by the wiring process shown in FIG. 9 and feed-through cells are connected to the clock signal lines as loads. More specifically, metal second layer 101 interconnects the subclock driver cells and clock signal lines 102 through 104 are adapted for transmission of clock signal Cj. Clock signal lines 102, 103 and 104 are formed of a metal first layer, a metal second layer and a metal first layer, respectively. Furthermore, vias 105 are provided. Segment 102 parallel to the cell array is assigned to the track which is nearest to the cell array. This is intended to prevent shorting of segment 104, which is exceptionally formed of the metal first layer, to the other vertical signal lines formed of a metal first layer.

According to the wiring method described above, since the through wiring of the metal second layer is possible, feed-through cells T properly function as such. Therefore, the loads of the subclock drivers can be uniformed using the feed-through cells, providing the same advantage as the previous embodiment.

The present invention need not be limited to the above embodiments. For example, as the main cell, not only a flip-flop but also any cell requiring a clock signal may be used.

Still another embodiment of the invention will be described with reference to FIG. 10.

This embodiment comprises: basic gate arrays 111 used as circuit elements; basic gate arrays 112 used not as circuit elements but as routing channels; system clock driver cell 114; clock signal line 115 interconnecting subclock driver cells 119; main cells 116, such as flip-flops, requiring a clock signal; clock signal line 117 connecting subclock driver cell 119 with corresponding main cells 116; and lines 118 connected to gates so as to uniform loads.

The layout procedure for the integrated circuit of FIG. 10 will be described with reference to FIG. 11.

In step S1, after the result of placement of cells is obtained, the interconnection of the cells is carried out in accordance with wiring requirement. In this case, the interconnection of each subclock driver cell and corresponding main cells is made first.

In step S2, the load imposed on each subclock driver is calculated to obtain the capacity of load short of the maximum load. For example, in cell arrays 111 of FIG. 10, two, three, four, two and two main cells 116 are connected to the respective subclock drivers 119 from the left of figure. That is, the maximum load of the subclock drivers is four main cells. Hence the cell arrays are two, one, one, zero, two and two main cells short of the maximum load, i.e. four main cells from the left of figure.

In step S3, gates which have no cells placed and thus do not act as transistors are searched for.

In step S4, gates which have been discovered in step S3 and have not been used for the interconnection in step S1 are selected. To use the selected gates as loads, routes are selected which are not short-circuited to the previous interconnecting lines. The selected gates are connected to the corresponding subclock driver through the selected routes.

Figure 12:
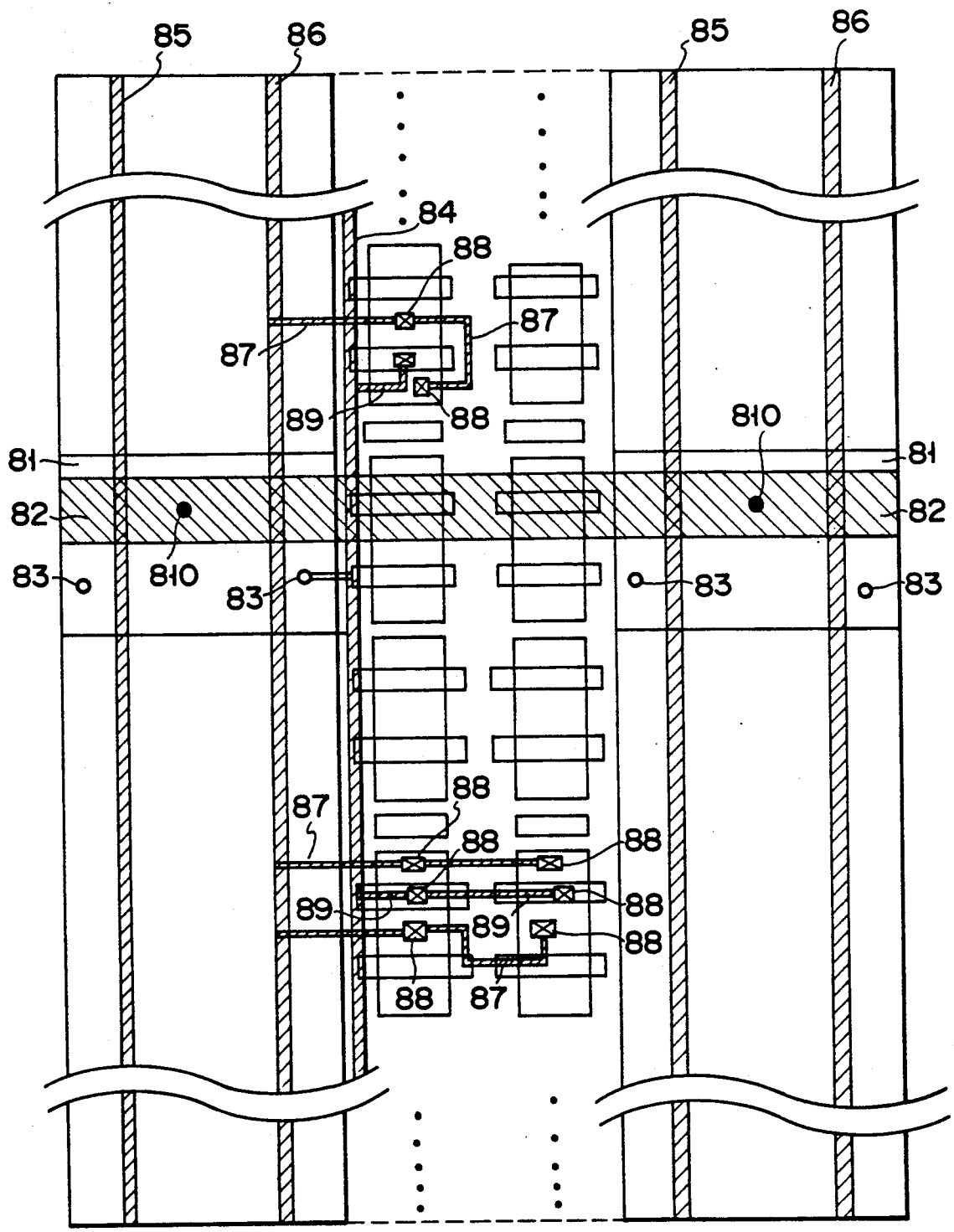
FIG. 12 shows a part of a pattern of an integrated circuit device subjected to a potential stabilization.

Before the selected gates are connected to the subclock driver using the routes selected in step S4, the source and drain potentials of the transistors acting as loads are held at the power supply potential in step S5. An integrated circuit device subjected to such a potential stabilization is shown in detail in FIG. 12. In this Figure, a line 82 interconnects subclock drivers 81 and a clock signal line 84 is provided for supplying a clock signal from the subclock driver to each main cell. Power supply and ground lines 85 and 86 are connected to each cell of the cell array. Signal lines 89 are provided for supplying clock signal to gates. Lines 87 are provided for holding the source and drain regions of transistors at the same potential. Contacts 88 are connected to lines 87.

Figure 13:
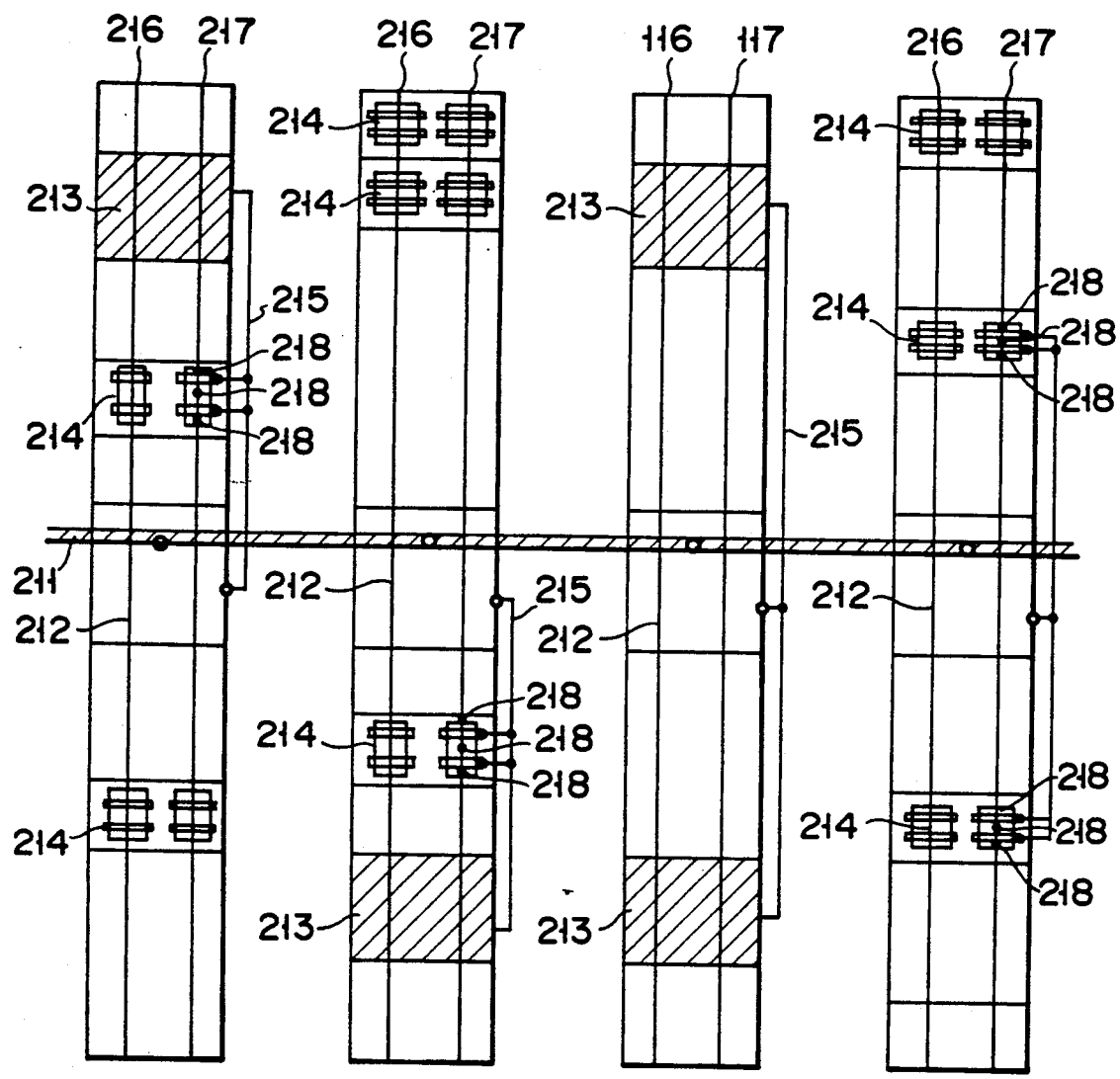
FIG. 13 shows a connection condition between the main cells and basic gates of each cell array.

FIG. 13 shows, by way of example, the result of placement of logic cells 214, subclock driver cells 212 and main cells 213 and the distribution state of a clock signal. In this Figure, a line 211 interconnects input terminals of subclock driver cells 212. Basic gates 214 are gates which are not used as logic cells. A line 215 connects the output terminal of a subclock driver to corresponding main cells 213. In this embodiment, as the clock distribution method, a method is adopted in which the subclock drivers in the respective cell arrays are arranged in line with each other and the clock signal is supplied from the subclock driver to the main cells arranged in the same array.

The automatic placement of the logic cells is performed taking account of uniformalization of the degree of crowding of wiring and minimization of the total wiring length as objective function. With the integrated circuit of FIG. 13, main cells 213 connected to the respective subclock driver 212 are one, one, two and zero in number from the leftmost cell array. Thus the main cells connected to the corresponding subclock drivers differ in number from cell array to cell array. In other words, the load imposed on each subclock driver differs from cell array to cell array. Therefore, unused gates 214 are connected to corresponding clock signal line 215 so that the subclock drivers are made uniform in their loads. In this embodiment, one main cell corresponds to two transistors. Hence two transistors are connected to a subclock driver which is short by one main cell. In this embodiment also, the source and drain of each transistor are held at the power supply potential or ground potential for stabilization of the transistor.

Figure 14:
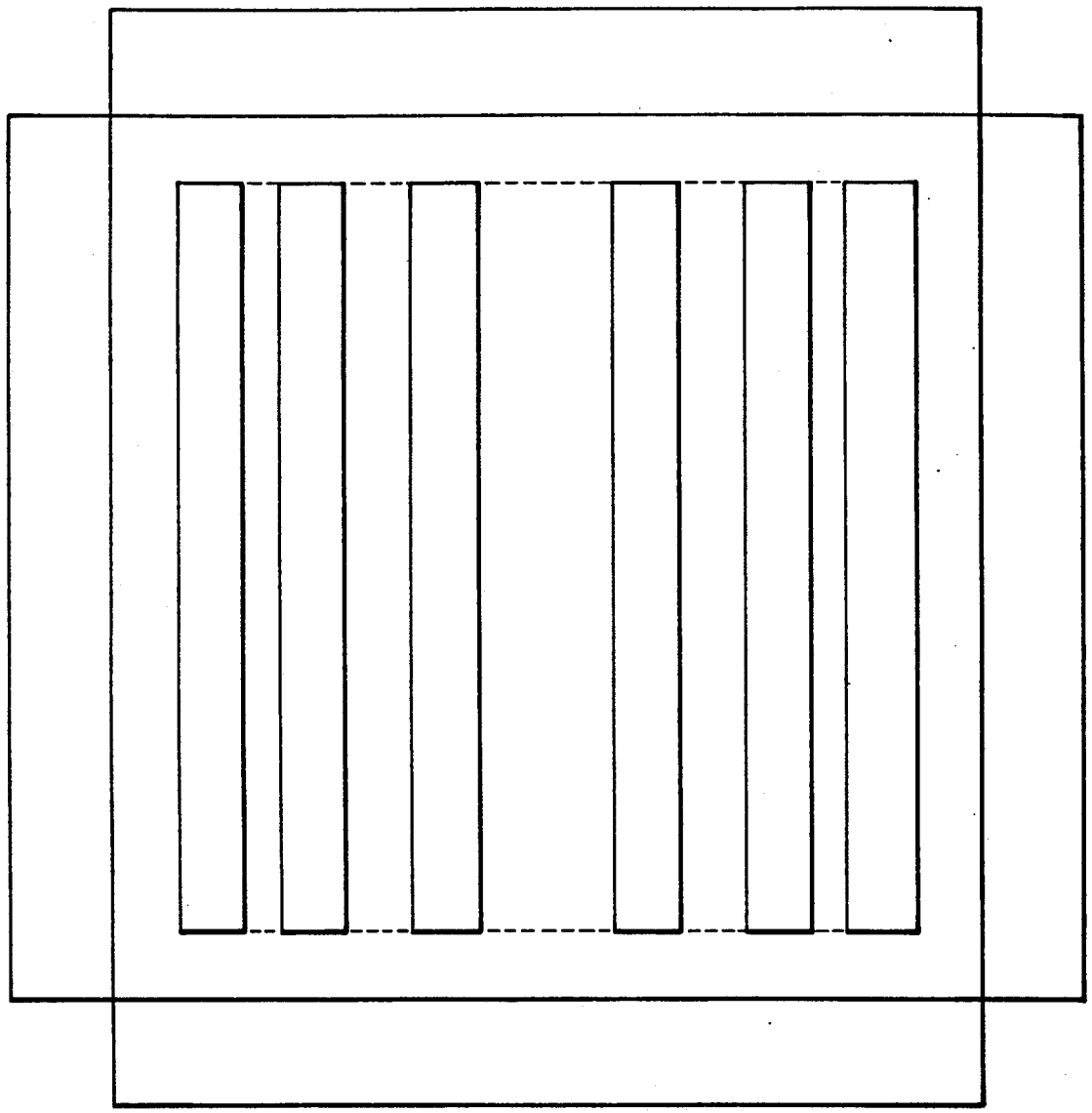
FIG. 14 shows a circuit pattern of an integrated circuit device according to a modification of FIG. 10.

In the embodiments of FIGS. 1 and 10, the cell arrays are arranged at regular intervals. Alternatively they may be arranged at irregular intervals as shown in FIG. 14.

According to an integrated circuit device shown in FIG. 15, basic gates 221 are arranged in the form of a matrix with no space. Input/output gate arrays 223 are provided around the matrix of basic gates 221 with nongate regions 222 interposed therebetween. Where matrix gates 221 are used like this embodiment, cell arrays with main cells may be placed on alternate arrays, for example, and cell arrays with no main cell may be used as through cell arrays for wiring. With such an arrangement, cells in cell arrays adjacent to the main cells may be used as cells which are adapted for uniformalization of loads. Thus, the route between a main cell and a basic gate as a pseudo-load may be short, simplifying the wiring layout.

According to the above embodiments, since unused transistors are used for uniformalizing the subclock drivers in their load, additional transistors need not be provided for load uniformalization and moreover the clock skew can be lowered.

What is claimed is:

1. A method of manufacturing a semiconductor integrated circuit device, comprising the steps of:
    forming, on a semiconductor chip, a plurality of cell arrays including at least one cell array having at least one main cell and at least one feed-through cell;
    arranging a plurality of clock driver cells on said plurality of cell arrays so that at least one of said clock driver cells is provided in each of said cell arrays;
    determining the number of said main cells in each of said cell arrays which are to be driven by said clock driver cells;
    detecting the maximum number of said main cells which it is determined are to be driven in the above step;
    calculating the difference between the detected maximum number of said main cells and the total number of said main cells included in each of said cell arrays; and
    connecting, to said clock driver cells, said feed-through cells, the number of which corresponds to the calculated difference, so that loads imposed on said clock driver cells are made substantially uniform.

2. The method according to claim 1, wherein said step for arranging said clock driver cells includes a step of arranging a plurality of clock driver cells on each of said cell arrays, and a step of selectively allocating a plurality of regions of each of said cell arrays to said clock driver cells included in the corresponding cell array.

3. The method according to claim 1, wherein said step of arranging said clock driver cells includes a step of obtaining the other difference between the difference and the number of feed-through cells, and a step of arranging additional feed-through cells on the corresponding cell array when the number of feed-through cells is less than the other difference.

4. A method of manufacturing a semiconductor integrated circuit device, comprising the steps of:
    forming, on a semiconductor chip, a plurality of basic-cell arrays including a plurality of basic cells having logical and non-logical cells;
    arranging a plurality of clock driver cells on said plurality of basic-cell arrays so that at least one of said driver cells is provided in each of said basic-cell arrays;
    determining the number of said logical cells to be driven by each of said clock driver cells;
    detecting the maximum number of the logical cells which it is determined are to be driven in said above step;
    calculating a difference between the detected maximum number of logical cells and the total number of said basic cells included in each of said basic-cell arrays; and
    connecting, to said clock driver cells, said non-logical cells, the number of which corresponds to the calculated difference, so that loads imposed to said clock driver cells are made substantially uniform.

5. The method according to claim 4, wherein said step of forming a plurality of basic-cell arrays includes a step of arranging said basic cells in a matrix, and said step of connecting said non-logical cells to said clock driver cells includes a step of connecting said clock driver cells to said basic cells of said basic-cell arrays which are adjacent to each of said clock driver cells and are used as a wiring region.

6. A method of manufacturing a semiconductor integrated circuit device, comprising the steps of:
    forming, on a semiconductor chip, a plurality of cell arrays each having at least one main cell and a plurality of feed-through cells over which signal lines are selectively run;
    arranging a plurality of clock driver cells on said plurality of cell arrays so that at least one of said clock driver cells is provided in each of said cell arrays;
    determining the number of said main cells in each of said cell arrays which are to be driven by each of said clock driver cells;
    detecting the maximum number of said main cells which it is determined are to be driven in the above step;
    calculating the difference between the detected maximum number of said main cells and the total number of said main cells included in each of said cell arrays; and
    connecting, to said clock driver cells, said feed-through cells, the number of which corresponds to the calculated difference, so that loads imposed on said clock driver cells are made substantially uniform.

7. A method of manufacturing a semiconductor integrated circuit device, comprising the steps of:
    forming, on a semiconductor chip, a plurality of cell arrays including at least one cell array having at least one main cell and at least one feed-through cell;
    arranging a plurality of clock driver cells on each of said plurality of cell arrays;

selectively allocating a plurality of regions of each of said cell arrays to said clock driver cells included in the corresponding cell array;

determining the number of said main cells to be driven by each of said clock driver cells;

detecting the maximum number of said main cells which it is determined are to be driven in the above step;

calculating the difference between the detected maximum number of said main cells and the total number of said main cells included in each of said cell arrays; and connecting, to said clock driver cells, said feed-through cells, the number of which corresponds to the calculated difference, so that loads imposed to said clock driver cells are made substantially uniform.

8. The method according to claim 7, wherein said step of arranging a plurality of clock driver cells includes a step of determining the other difference between the difference and the number of feed-through cells, and a step of arranging additional feed-through cells on the corresponding cell array, when the number of feed-through cells is less than the other difference.

9. A method of manufacturing a semiconductor integrated circuit device, comprising the steps of:

forming, on a semiconductor chip, a plurality of basic-cell arrays including a plurality of basic cells having logical and non-logical cells;

arranging a plurality of clock driver cells on said plurality of basic-cell arrays;

determining the number of said logical cells to be driven by each of said clock driver cells;

detecting the maximum number of logical cells which it is determined are to be driven in said above step;

calculating a difference between the detected maximum number of logical cells and the total number of said basic cells included in each of said basic-cell arrays; and connecting, to said clock driver cells, said non-logical cells, the number of which corresponds to the calculated difference, so that loads imposed on said clock driver cells are made substantially uniform.

10. The method according to claim 9, wherein the step of forming a plurality of basic-cell arrays includes a step of arranging said basic cells in a matrix, and the step of connecting said non-logical cells to said clock driver cells includes a step of connecting said clock driver cells to said basic cells of said basic-cell arrays which are adjacent to each of said clock driver cells and are used as a wiring region.

* * * * *